United States Patent
Chen et al.

(10) Patent No.: US 7,790,518 B2
(45) Date of Patent: Sep. 7, 2010

(54) METHOD OF TRIMMING SEMICONDUCTOR ELEMENTS WITH ELECTRICAL RESISTANCE FEEDBACK

(75) Inventors: Bomy Chen, Cupertino, CA (US); Ya-Fen Lin, Santa Clara, CA (US); Zhitang Song, Shanghai (CN); Songlin Feng, Shanghai (CN)

(73) Assignee: Silicon Storage Technology, Inc., Sunnyvale, CA (US)

( * ) Notice: Subject to any disclaimer, the term of this patent is extended or adjusted under 35 U.S.C. 154(b) by 30 days.

(21) Appl. No.: 12/027,916

(22) Filed: Feb. 7, 2008

(65) Prior Publication Data

US 2008/0131982 A1 Jun. 5, 2008

Related U.S. Application Data

(62) Division of application No. 10/983,314, filed on Nov. 4, 2004, now Pat. No. 7,351,613.

(51) Int. Cl.
*H01L 21/82* (2006.01)
(52) U.S. Cl. ........................ 438/131; 438/467; 438/600; 257/E23.147
(58) Field of Classification Search ................. 438/131, 438/467, 600; 257/E23.147
See application file for complete search history.

(56) References Cited

U.S. PATENT DOCUMENTS

| 5,536,947 | A | | 7/1996 | Klersy et al. |
| 5,627,098 | A | * | 5/1997 | Iranmanesh ............... 438/600 |
| 6,033,938 | A | | 3/2000 | Voogel et al. |
| 6,087,674 | A | | 7/2000 | Ovshinsky et al. |
| RE37,259 | E | | 7/2001 | Ovshinsky |
| 2006/0137402 | A1 | | 6/2006 | Eichholz et al. |

* cited by examiner

*Primary Examiner*—Fernando L Toledo
(74) *Attorney, Agent, or Firm*—DLA Piper LLP (US)

(57) ABSTRACT

A method of trimming down the volume of a semiconductor resistor element using electrical resistance feedback. After forming conductive material disposed between a pair of electrodes, a voltage is applied to the electrodes to produce an electrical current through the conductive material sufficient to heat and melt away a portion of the conductive material. By reducing the volume of the conductive material, its resistance is increased. The application of the voltage is ceased once the desired dimensions (and thus resistivity) of the conductive material is reached. The resulting semiconductor resistor element could have a fixed resistance, or could have a variable resistance (by using phase change memory material).

13 Claims, 1 Drawing Sheet

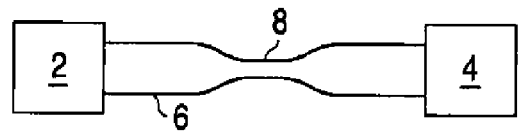
FIG. 1
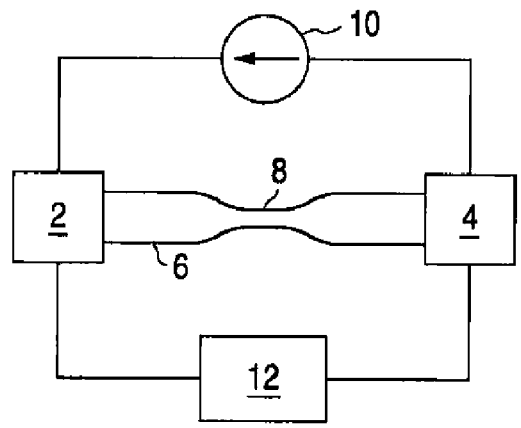
FIG. 2
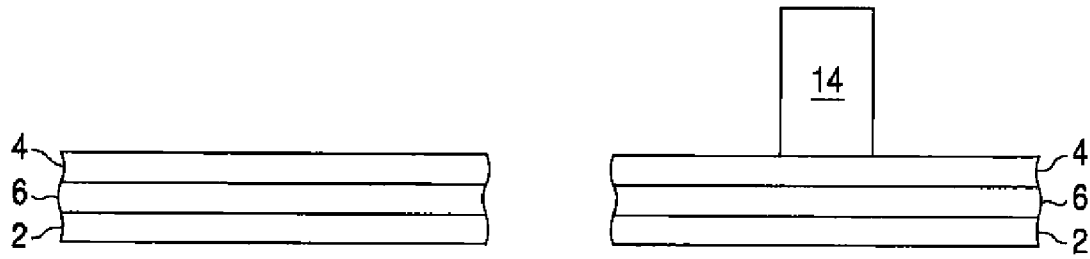
FIG. 3A          FIG. 3B
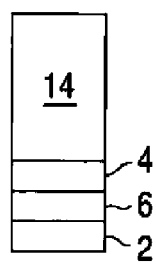    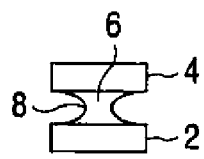    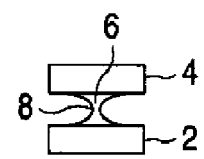
FIG. 3C    FIG. 3D    FIG. 3E

METHOD OF TRIMMING SEMICONDUCTOR ELEMENTS WITH ELECTRICAL RESISTANCE FEEDBACK

This application is a divisional of U.S. application Ser. No. 10/983,314, filed Nov. 4, 2004, now U.S. Pat. No. 7,351,613 which is incorporated herein by reference.

FIELD OF THE INVENTION

The present invention relates to semiconductor devices, and more particularly to electrical resistors and memory material, and the formation thereof, in semiconductor devices.

BACKGROUND OF THE INVENTION

Presently, electrical resistors are formed in semiconductor devices by forming elements of conductive material with neck portions of reduced cross-section and/or volume The reduced cross-section/volume of the neck portion increases the electrical resistance of the resistor element by reducing the amount of material through which electrical current must pass.

Semiconductor electrical resistor elements are conventionally made by forming a strip of conductive material horizontally or vertically over the semiconductor substrate, and then trimming a portion of the strip using laser ablation to form a neck portion of known and reduced cross-section area. The resulting electrical resistance of the conductive element will be a function of the conductivity of the material used to form the element, and the physical dimensions of the neck portion.

One drawback to the conventional formation of semiconductor electrical resistors is that it can be difficult to accurately form the neck portions with the desired dimensions for certain devices. Deviations in neck portion cross-sectional size can not only drastically change the intended electrical performance of these resistors, but can also cause the devices in which they are contained to fail. For example, semiconductor electrical resistors are used to operate program, read, erase) memory cell arrays. In order for a memory cell array to properly work, the electrical performance of each memory cell must be comparable, so that when the memory cells are read only those that have been programmed will be identified as such. However, since such arrays can contain millions of memory cells, and the physical dimensions of the memory cells are constantly shrinking, it can be extremely difficult to ensure that resistors throughout the array all have the precise desired neck portion dimensions.

There is a need for a improved technique for forming semiconductor resistors.

SUMMARY OF THE INVENTION

The present invention is a method of forming a semiconductor device that includes forming a pair of electrodes, forming conductive material in electrical contact with the pair of electrodes, applying a first voltage to the electrodes to produce an electrical current through the conductive material sufficient to heat and melt away a portion of the conductive material, measuring a resistivity of the conductive material, and ceasing the application of the first voltage in response to the measured resistivity reaching a predetermined value.

Other objects and features of the present invention will become apparent by a review of the specification, claims and appended figures.

BRIEF DESCRIPTION OF THE DRAWINGS

FIG. 1 is a top view of the semiconductor resistor of the present invention.

FIG. 2 is a schematic diagram showing the circuitry used to perform the trimming technique of the present invention.

FIGS. 3A to 3E are side cross sectional views showing the manufacturing and trimming techniques of the present invention.

DETAILED DESCRIPTION OF THE PREFERRED EMBODIMENTS

The present invention is an improved technique for forming semiconductor resistors, where electrical current is used to trim down the dimensions or volume of the resistor material, and set the final resistance of the semiconductor resistors, and electrical resistance feedback is used to terminate the trim process once the desired component dimensions (and resistance) are achieved. FIG. 1 illustrates the semiconductor resistor 1 of the present invention, which includes a pair of electrodes 2/4, and a strip of conductive material 6 extending therebetween. Strip 6 preferably includes a neck portion 8 having a reduced cross sectional size compared to other portions of strip 6. Assuming neck portion 8 constitutes the smallest cross sectional area of strip 6, the dimensions of neck portion 8 mainly dictate the resistivity of resistor 1.

Strip 6 is preferably formed by forming (i.e. depositing, growing etc.) a strip 6 of conductive material between the pair of electrodes 2/4, and then trimming a portion of the strip 6 using laser ablation or a material etch process to form neck portion 8. Then, the dimensions of the neck portion 8 are trimmed down (via melting or otherwise dissolving the material) using a melt/trim process until the desired resistivity is reached (i.e. met or exceeded). The melt/trim process involves passing a relatively high electrical current through the strip 6. Because the neck portion 8 preferably has the smallest cross sectional area along strip 6, heat generated by the electrical current will generally heat the neck portion 8 until the conductive material thereof begins to melt (i.e. dissolve). As the neck portion 8 melts away, its cross sectional dimensions become smaller, thus increasing the resistivity of the resistor. The electrical current is terminated (thus ending the melt/trim process) once the resistor reaches its desired resistivity. In this manner, each semiconductor resistor can be separately and accurately trimmed until it exhibits the desired resistivity.

FIG. 2 illustrates a simple schematic diagram of exemplary circuitry used in the melt/trim process. A constant current or voltage source 10 is connected across electrodes 2/4 that applies a voltage to the electrodes 2/4 to generate the electrical current for trimming the neck portion 8 of the conductive strip 6. A voltage or current measurement device 12 is also connected across electrodes 2/4 for detecting when the desired resistivity of the conductive strip 6 is reached, and thus when the melt/trim process should be terminated. The voltage source 10 and/or measurement device 12 can be part of the semiconductor device, or external to it. The trimming electrical current from source 10 can be constant, alternating, varied, ramped, or even pulsed (with a low level electrical current used between the pulses to measure the resistivity of conductive strip). Thus, resistivity can be measured during the application of the trimming current, between periodic applications of the trimming current, or between a succession of trimming pulses. Using this electrical process for measuring the trimmed dimensions of the resistor, the diameter of the neck portion 8 can be accurately reduced to diameters as low as 20 to 100 Å, or even lower.

FIGS. 3A to 3E illustrate an exemplary process for forming the resistor 1 of the present invention. A layer of conductive material (e.g. W or TiW around 1000 Å thick) is first formed (e.g. by chemical vapor deposition—CVD) which eventually forms electrode 2. A layer of conductive material (e.g. low melting viscous point materials such as Sn or Al, mid-melting viscous point silicide materials such as TiSix, CoSix, or NiSix, etc.) is formed over the electrode layer 2, which eventually forms the conductive strip 6. Another layer of conductive material (e.g. W or TiW around 1000 Å thick) is formed over conductive strip layer 6, which eventually forms electrode 4, as shown in FIG. 3A.

A photo lithographic process is then performed that forms photo resist 14 over the structure, followed by photo illumination and removal that removes selected portions of the photo resist 14 (e.g. leaving selected portions around 1000 Å in diameter), as shown in FIG. 3B. Anisotropic etch process(es) follow, to remove exposed portions of electrode layers 2/4 and conductive layer 6 (i.e. those portions that protected by the remaining photo resist 14), as illustrated in FIG. 3C. After the photo resist is removed, an isotropic selective etch is performed (e.g. wet etch, DCE, etc.) that removes exposed side portions of conductive layer 6 to form neck portions therein, while leaving electrode layers 2/4 largely intact, as shown in FIG. 3D. Finally, a relatively high electrical current is passed through the conductive layer 6 to trim down its dimensions, as shown in FIG. 3E.

With the present invention, the resistors are individually trimmed to set the resistivity thereof after most or all of the surrounding semiconductor components have been formed. Thus, performance of millions of resistors (and the components in which they reside) all have the desired operational characteristics, even if aberrations in the manufacturing process would have caused equally dimensioned resistors to otherwise perform differently from each other.

It should be noted that the element trimming technique of the present invention is not limited to fixed resistance semiconductor resistors, but can be used to trim any conductive semiconductor device. For example, the above described trimming technique could be used to make variable (programmable) resistors, which can be used as the actual memory portion of non-volatile memory cells. In such a case, the conductive material forming strip 6 could be formed of phase change memory material, such as, for example, chalcogenide. Phase change memory material is known, and has been proposed as a material for use in making non-volatile memory devices, where the phase change material can be electrically switched (programmed) between different structured states that exhibit different electrical read-out properties. The preferred phase change material is a chalcogenide alloy, which includes at least one Group VI element (e.g. $Ge_2Sb_2Te_5$). The amount of chalcogenide material in the memory cell can dictate the speed and power consumption of the memory cell. Further, all the chalcogenide memory cells ideally exhibit near identical performance to minimize read errors. Thus, accurately trimming the chalcogenide material using the above described technique is an ideal method of forming phase change memory material arrays. With the present invention, electrical current flowing through the chalcogenide material can be used to trim it down in size, to program the memory material, and to read the material's resistivity.

The chalcogenide material is programmed by heating the material, whereby the amplitude and duration of the heating cycle dictates what portions of the chalcogenide are left in an amorphous state and/or a crystallized state, and thus what the resulting overall electrical resistivity of the chalcogenide material is. The relative amount of the chalcogenide material left in either state is continuously variable, as too is the resulting resistivity. Heat for programming can be generated by the chalcogenide material itself by electrical current flowing therethrough. Alternately or additionally, one or both of the electrodes can have an increased resistivity to act as a thermal heater for the chalcogenide layer.

To amorphousize the chalcogenide memory material, it is heated to a temperature beyond its amorphousizing temperature $T_A$, but below a temperature that would trim away any of the memory material. Once this temperature is reached, the volume of memory material is rapidly cooled by removing the electrical current flow. So long as the memory material is cooled faster than the rate at which it can crystallize, the memory material is left in a relatively high resistive amorphous state. To crystallize the memory material, it is heated beyond its crystallization temperature $T_C$ (which is lower than $T_A$) and maintained above that temperature for a sufficient time to allow the memory material to crystallize. After such time, the electrical current flow is removed, and the memory material is left in a relatively low resistive crystallized state. It is also possible to vary the thermal pulse amplitude and duration to produce varying degrees of resistivity for multi-bit storage in a single memory cell.

To read the memory cell, an electrical current is passed through the memory cell that has an amplitude and/or duration that is insufficient to program or trim the memory cell, but is sufficient to measure its resistivity. Low or high resistivities (corresponding to crystallized or amorphous states respectively of the memory material) represent digital "1" or "0" values (or a range of resistivities representing multiple bits of data). These values are maintained by the memory cells until they are reprogrammed.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween). For example, forming an element "over a substrate" can include forming the element directly on the substrate with no intermediate materials/elements therebetween, as well as forming the element indirectly on the substrate with one or more intermediate materials/elements therebetween.

It is to be understood that the present invention is not limited to the embodiment(s) described above and illustrated herein, but encompasses any and all variations falling within the scope of the appended claims. For example, materials, processes and numerical examples described above are exemplary only, and should not be deemed to limit the claims. Further, as is apparent from the claims and specification, not all method steps need be performed in the exact order illustrated or claimed, but rather in any order that allows the proper formation of the resistor 1 or memory cell of the present invention. Resistors 1 or memory cells using phase change memory materials need not have a neck portion 8, as trimming could be performed over the length of strip 6. Resistors 1 or memory cells can be formed vertically (electrodes above and below strip 6) or laterally (electrodes on either side of strip 6). Lastly, single layers of material could be formed as multiple layers of such or similar materials, and vice versa.

What is claimed is:

1. A method of forming a semiconductor device, comprising:
   forming a pair of electrodes;
   forming conductive material in electrical contact with the pair of electrodes;
   applying a first voltage to the electrodes to produce an electrical current through the conductive material sufficient to heat and melt away a portion of the conductive material;
   measuring a resistivity of the conductive material; and
   ceasing the application of the first voltage in response to the measured resistivity reaching a predetermined value.

2. The method of claim 1, further comprising:
   forming a neck portion of reduced cross sectional area in the conductive material before the application of the first voltage.

3. The method of claim 2, wherein the formation of the neck portion includes performing an etch process to remove exposed side portions of the conductive material.

4. The method of claim 2, wherein the heat from the electrical current reduces the cross sectional area of the neck portion.

5. The method of claim 4, wherein the melting away of the portion of the conductive material increases a resistivity of the neck portion.

6. The method of claim 1, wherein the conductive material is configured into a strip, and wherein a resistivity of the strip increases as the portion of the conductive material is melted away.

7. The method of claim 6, wherein the strip includes a neck portion of reduced cross sectional area from which the conductive material is melted away by the heat produced from the electrical current.

8. The method of claim 1, wherein the first voltage is constant, ramped or pulsed.

9. The method of claim 1, wherein the first voltage and the electrical current are pulsed, and wherein the measuring of the resistivity of the conductive material is performed in-between the electrical current pulses.

10. The method of claim 1, wherein the first voltage and the electrical current have constant amplitudes.

11. The method of claim 1, wherein the conductive material is formed of phase change memory material.

12. The method of claim 11, further comprising:
    applying a second voltage lower than the first voltage to the electrodes to produce a second electrical current through the phase change memory material sufficient to amorphousize or crystallize the phase change memory material.

13. The method of claim 12, further comprising:
    measuring a resistivity of the phase change memory material after the application of the second voltage.

* * * * *